US009191033B2

(12) United States Patent
Mangano et al.

(10) Patent No.: US 9,191,033 B2
(45) Date of Patent: Nov. 17, 2015

(54) CIRCUIT FOR ASYNCHRONOUS COMMUNICATIONS, RELATED SYSTEM AND METHOD

(71) Applicant: STMicroelectronics S.r.l., Agrate Brianza (IT)

(72) Inventors: Daniele Mangano, San Gregorio di Catania (IT); Salvatore Pisasale, Catania (IT); Carmelo Pistritto, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 304 days.

(21) Appl. No.: 13/854,419

(22) Filed: Apr. 1, 2013

(65) Prior Publication Data
US 2013/0259146 A1 Oct. 3, 2013

(30) Foreign Application Priority Data
Apr. 2, 2012 (IT) .............................. TO2012A0289

(51) Int. Cl.
*H04L 27/00* (2006.01)
*H03M 13/00* (2006.01)
(Continued)

(52) U.S. Cl.
CPC ....... *H03M 13/6522* (2013.01); *G06F 13/4286* (2013.01); *H03M 13/51* (2013.01)

(58) Field of Classification Search
CPC .. H04B 3/32; H04M 11/062; H03M 13/6522; H03M 13/51; G06F 13/4286
USPC .......................................................... 375/259
See application file for complete search history.

(56) References Cited

U.S. PATENT DOCUMENTS 5,265,216 A * 11/1993 Murphy et al. ............... 710/105
6,292,023 B1 * 9/2001 Herrera et al. ................. 326/46
6,359,946 B1 * 3/2002 Ryan ............................. 375/371
(Continued)

FOREIGN PATENT DOCUMENTS

WO 03/069485 A2 8/2003

OTHER PUBLICATIONS

Campobello et al., "GALS Networks on Chip: A New Solution for Asynchronous Delay-Insensitive Links," Design, Automation and Test in Europe, 2006 (DATE '06); Proceedings vol. 2; Year: 2006, pp. 1-6.
Hauck, "Asynchronous Design Methodologies: An Overview," *Proceedings of the IEEE*, vol. 83, No. 1, pp. 69-93, Jan. 1995.
Ho et al., "A Power-Efficient Integrated Input/Output Completion Detection Circuit for Asynchronous-Logic Quasi-Delay-Insensitive Pre-Charged Half-Buffer," Integrated Circuits (ISIC), IEEE, pp. 376-379, Dec. 12, 2011.
(Continued)

*Primary Examiner* — Erin File
(74) *Attorney, Agent, or Firm* — Seed IP Law Group PLLC

(57) ABSTRACT

A completion-detector circuit for detecting completion of the transfer of asynchronous data on a communication channel with signal lines organized according to a delay-insensitive encoding (e.g., dual-rail, m-of-n, Berger encoding) comprises: logic circuitry for detecting the data on the aforesaid signal lines configured for: i) producing a first signal indicating the fact that the asynchronous data on the signal lines are stable; ii) producing a second signal indicating the fact that the signal lines are de-asserted; and an asynchronous finite-state machine supplied with the first signal and the second signal for producing a signal of detection of completion of transfer of the asynchronous data, the detection signal having: a first value, when the first signal is asserted; and a second value, when the second signal is asserted; and being on hold when neither one nor the other of said first signal and said second signal is asserted.

30 Claims, 3 Drawing Sheets

(51) Int. Cl.
*H03M 13/51* (2006.01)
*G06F 13/42* (2006.01)

(56) References Cited

U.S. PATENT DOCUMENTS

| | | | |
|---|---|---|---|
| 6,952,400 B1* | 10/2005 | Kang et al. | 370/230 |
| 2005/0066077 A1* | 3/2005 | Shibata et al. | 710/33 |
| 2008/0315934 A1* | 12/2008 | Engl | 327/306 |
| 2009/0122950 A1* | 5/2009 | Cheung et al. | 377/47 |
| 2012/0212271 A1* | 8/2012 | Dally et al. | 327/199 |
| 2012/0274377 A1* | 11/2012 | Alben et al. | 327/199 |
| 2014/0191813 A1* | 7/2014 | Sul et al. | 331/46 |

OTHER PUBLICATIONS

Italian Search Report, dated Dec. 3, 2012 for Italian application No. TO20120289, 138 pages.

Meng et al., "Automatic Synthesis of Asynchronous Circuits from High-level Specifications," IEEE Transactions on Computer-Aided Design, vol. 8, No. 11, Nov. 1989, pp. 1185-1205.

Sawasaki et al., "Externally Hazard-Free Implementations of Asynchronous Control Circuits," IEEE Transactions on Computer-Aided Design of Integrated Circuit and Systems, vol. 16, No. 8, Aug. 1977, pp. 835-848.

* cited by examiner

CIRCUIT FOR ASYNCHRONOUS COMMUNICATIONS, RELATED SYSTEM AND METHOD

BACKGROUND

1. Technical Field

The present disclosure relates to asynchronous communications, including communications in Systems on Chip (SoC) and Networks on Chip (NoC). Such systems may include NoCs having a number of IP cores (e.g., Field-Programmable Gate Arrays (FPGAs), Application-Specific Integrated Circuits (ASICs), etc.).

2. Description of the Related Art

Recourse to technologies on a submicrometric scale in the production of micro-electronic systems such as systems SoCs may induce phenomena of various nature (known as "deep-submicron effects") that may result in limitations in terms of performance and/or productivity. Said effects may be noted, for example, in 32-nm technologies and, in an even greater extent, in 22-nm technologies.

BRIEF SUMMARY

In an embodiment, a completion detector circuit for asynchronous data transfer over a communication channel with signal lines organized in a delay-insensitive coding arrangement, includes: logic circuitry configured for detecting data on said signal lines and generating: i) a first signal indicative of the fact that the asynchronous data on said signal lines are stable, ii) a second signal indicative of said signal lines being de-asserted, and an asynchronous finite state machine supplied with said first signal and said second signal and configured for generating a detection signal of the completion of asynchronous data transfer on said signal lines, said detection signal having: a first value when said first signal is asserted, a second value, when said second signal is asserted, and being on hold when neither the one nor the other of said first signal and said second signal is asserted. In an embodiment, said asynchronous finite state machine includes: at least a first and a second flip-flop clocked by said first signal and said second signal, respectively; said flip-flops being arranged in a inverting loop wherein: i) the output of the first flip-flop is input to the second flip-flop, ii) the output of the second flip-flop is input to the first flip-flop after logical inversion, and X-OR logic X-ORing the outputs of said flip-flops. In an embodiment, said signal lines include a plurality of groups of lines, the lines in each group organized in a delay-insensitive coding arrangement, wherein said logic circuitry includes: detection logics configured for i) detecting that the asynchronous data on the signal lines in each said group are stable and generating a respective group assertion signal for each said group, and ii) detecting that the signal lines in each said group are de-asserted and generating a respective group de-assertion signal for each said group, and aggregation logics configured for receiving said respective group assertion and group de-assertion signals from said detection logics and generating: said first signal when said respective group assertion signals are identical for all the groups in said plurality, and said second signal when said respective group de-assertion signals are identical for all the groups in said plurality. In an embodiment, said delay-insensitive coding is selected out of dual-rail, m-of-n and Berger coding. In an embodiment, said signal lines include one or more groups of lines, with the lines in the group or each group organized in a delay-insensitive coding arrangement, wherein said logic circuitry includes sorter circuitry configured for detecting the asynchronous data on the signal lines in the group or each said group as being stable when a given number of signal lines of the respective group is asserted. In an embodiment, said signal lines include one or more groups of lines, with the lines in the group or each group organized in a delay-insensitive Berger coding arrangement, wherein said logic circuitry for detecting the asynchronous data on the signal lines in the group or each said group as being stable includes a multiplexer which receives as input said asynchronous data rearranged by sorter circuitry and a control signal for the multiplexer representative of the sum of zeros contained in said asynchronous data. In an embodiment, said signal lines include one or more groups of lines, with the lines in the group or each group organized in a delay-insensitive coding arrangement, wherein said logic circuitry for detecting that the signal lines in the or each said group are de-asserted includes at least one logical sum circuit connected to the signal lines of the group or each said group. In an embodiment, said signal lines include one or more groups of lines, with the lines in the group or each group organized in a delay-insensitive Berger coding arrangement, wherein said at least one logical sum circuit is configured for implementing the logical sum of all the data bits and check bits in the Berger coding. In an embodiment, said logic circuitry sense said signal lines as alleged and as de-asserted when at logic level "1" and logic level "0", respectively.

In an embodiment, a system includes: a transmitter and a receiver with a communication channel for the transmission of asynchronous data therebetween, said communication channel including signal lines organized according to a delay insensitive coding arrangement, a detector circuit coupled to said communication channel to generate said detection signal, and wherein: the receiver is configured to assert an acknowledgement signal towards the transmitter when said detection signal assumes a first value, indicative of the fact that said asynchronous data on said channel are stable, the transmitter is configured to de-assert its outputs to the signal lines of said communication channel when the transmitter detects said acknowledgment signal being asserted by the receiver; the receiver is configured to de-assert said acknowledgment signal towards the transmitter when said detection signal assumes a second value, indicative of the fact that the transmitter has de-asserted its outputs to the signal lines of said communication channel; and the transmitter is configured to recognize said acknowledgment signal being de-asserted by the receiver, whereby the system is reset for a new transmission of asynchronous data over said communication channel. In an embodiment, said system is a System-on-Chip or SoC.

In an embodiment, a completion detection method for asynchronous data transfer over a communication channel with signal lines organized in a delay-insensitive coding arrangement includes: detecting data on said signal lines and generating: i) a first signal indicative of the fact that the asynchronous data on said signal lines are stable, ii) a second signal indicative of said signal lines being de-asserted, and supplying said first signal and said second signal to an asynchronous finite state machine to generate a detection signal of the completion of asynchronous data transfer on said signal lines, said detection signal having: a first value when said first signal is asserted, a second value, when said second signal is asserted, and being on hold when neither the one nor the other of said first signal and said second signal is asserted.

Various embodiments may envisage recourse to an asynchronous finite-state machine (AFSM), implemented, for example, via flip-flops, and thus avoid recourse to a C-element logic, in particular in the case of a four-phase delay-insensitive communication (4 PHASE DI).

Various embodiments may be based, for example, in relation to an m-of-n (or dual-rail, as 1-of-2 particular case) encoding, on the criterion of detecting the stability of the data by verifying the condition whereby a given number (e.g., m) of the (e.g., n) lines are asserted, possibly identifying, in the case where the lines are shared over a number of groups, the global condition of stability of the data as the one whereby the data are stable in all and every one of the groups. Various embodiments may be based upon the criterion of detecting the return-to-zero condition as the one in which all the bits are at zero, possibly identifying, in the case where the lines are shared over a number of groups, the overall return-to-zero condition as the one whereby, in all and every one of the groups, all the bits are at zero. Various embodiments may envisage the use of DI encodings of various types, for example, the use of a Berger encoding, etc. Various embodiments may envisage a logic-detection micro-architecture that may be applied to any one type of DI encoding also with very wide buses.

In an embodiment, a device comprises: an input module configured to detect data on a plurality of signal lines and to generate: a first signal indicative of asynchronous data on said plurality of signal lines satisfying a stability criteria; and a second signal indicative of said plurality of signal lines being de-asserted; and an output module configured to generate a detection signal having: a first value when said first signal is asserted; and a second value when said second signal is asserted, wherein the output module is configured to hold a current value of the detection signal when the first and second signals are not asserted. In an embodiment, wherein the output module comprises an asynchronous finite state machine. In an embodiment, said asynchronous finite state machine comprises: a first flip-flop clocked by said first signal; a second flip-flop clocked by said second signal, wherein the first flip-flop and the second flip-flop are coupled together in a loop; and a detection signal generator configured to generate the detection signal based on an output of the first flip-flop and an output of the second flip-flop. In an embodiment, the loop is configured to couple the output of the first flip-flop to an input of the second flip-flop and to couple an inverted output of the second flip-flop to an input of the first flip-flop. In an embodiment, the detection signal generator comprises logic configured to exclusive-or the output of the first flip-flop and the output of the second flip-flop. In an embodiment, the stability criteria is based on a delay-insensitive coding scheme. In an embodiment, said delay-insensitive coding scheme comprises at least one of a dual-rail coding scheme; an m-of-n coding scheme; and a Berger coding scheme. In an embodiment, said plurality of signal lines include one or more groups of signal lines and said input module is configured to: determine, for each group, whether data on the signal lines of the group satisfy a group-stability criteria; in response to determining that data on the signal lines of each group satisfy the group-stability criteria, assert the first signal; determine, for each group, whether the signal lines of the group are de-asserted; and in response to determining that the signal lines of each group are de-asserted, assert the second signal. In an embodiment, the group-stability criteria is based on a delay-insensitive coding scheme. In an embodiment, said delay-insensitive coding scheme comprises at least one of a dual-rail coding scheme; an m-of-n coding scheme; and a Berger coding scheme. In an embodiment, the input module is configured to determine whether the group-stability criteria is satisfied by determining whether a given number of signal lines of the respective group are asserted. In an embodiment, the lines of each group are organized in a delay-insensitive Berger coding arrangement and the input module includes a sorter configured to rearrange asynchronous data of a group and a multiplexer which receives said asynchronous data rearranged by the sorter, wherein a control signal of the multiplexer is based on a number of zeros contained in said asynchronous data of the group. In an embodiment, the input module comprises at least one logic gate configured to determine whether all the lines of a group are de-asserted. In an embodiment, the lines in each group are organized in a delay-insensitive Berger coding arrangement, wherein said at least one logic gate is configured to determine whether all the data bits and check bits in the Berger coding are de-asserted. In an embodiment, the input module is configured to determine a signal line is de-asserted when the signal line has a logic level "0".

In an embodiment, a system comprises: a transmitter; a receiver; a communication channel including a plurality of signal lines and configured to carry asynchronous data between the transmitter and receiver; and a detector coupled to the plurality of signal lines and including: an input module configured to detect data on a plurality of signal lines and to generate: a first signal indicative of asynchronous data on said plurality of signal lines satisfying a stability criteria; and a second signal indicative of said plurality of signal lines being de-asserted; and an output module configured to generate a detection signal having: a first value when the first signal is asserted; and a second value when said second signal is asserted, wherein the output module is configured to hold a current value of the detection signal when the first and second signals are not asserted. In an embodiment, the receiver is configured to transmit an acknowledgement signal to the transmitter when said detection signal has said first value; the transmitter is configured to de-assert outputs to the signal lines of said communication channel when the transmitter detects said acknowledgment signal transmitted by the receiver; the receiver is configured to de-assert said acknowledgment signal when said detection signal has said second value; and the transmitter is configured to recognize said acknowledgment signal being de-asserted by the receiver. In an embodiment, said system is a System-on-Chip (SoC). In an embodiment, the output module comprises an asynchronous finite state machine including: a first flip-flop clocked by said first signal; a second flip-flop clocked by said second signal, wherein the first flip-flop and the second flip-flop are coupled together in a loop; and a detection signal generator configured to generate the detection signal based on an output of the first flip-flop and an output of the second flip-flop. In an embodiment, the loop is configured to couple the output of the first flip-flop to an input of the second flip-flop and to couple an inverted output of the second flip-flop to an input of the first flip-flop. In an embodiment, the detection signal generator comprises logic configured to exclusive-or the output of the first flip-flop and the output of the second flip-flop. In an embodiment, the stability criteria is based on a delay-insensitive coding scheme. In an embodiment, said plurality of signal lines include one or more groups of signal lines and said input module is configured to: determine, for each group, whether data on the signal lines of the group satisfy a group-stability criteria; in response to determining that data on the signal lines of each group satisfy the group-stability criteria, assert the first signal; determine, for each group, whether the signal lines of the group are de-asserted; and in response to determining that the signal lines of each group are de-asserted, assert the second signal. In an embodiment, the group-stability criteria is based on a delay-insensitive coding scheme.

In an embodiment, a method comprises: asserting a first signal when asynchronous data on a plurality of signal lines satisfy a stability criteria; asserting a second signal when the signal lines are de-asserted; generating a detection signal having a first value when the first signal is asserted and a second value when the second signal is asserted; and maintaining a current value of the detection signal when the first signal and the second signal are not asserted. In an embodiment, the stability criteria are based on a delay-insensitive coding scheme. In an embodiment, the plurality of signal lines comprise a plurality of groups of signal lines and the method includes: determining, for each group, whether data on the signal lines of the group satisfy a group-stability criteria; in response to determining that data on the signal lines of each group satisfy the group-stability criteria, asserting the first signal; determining, for each group, whether the signal lines of the group are de-asserted; and in response to determining that the signal lines of each group are de-asserted, asserting the second signal.

In an embodiment, a system comprises: means for determining whether asynchronous data on a plurality of signal lines satisfy a stability criteria; means for determining whether the signal lines of the plurality are de-asserted; and means for setting a detection signal to a first value in response to a determination that the asynchronous data on the plurality of signal lines satisfy the stability criteria, setting the detection signal to a second value in response to a determination that the plurality of signal lines are de-asserted, and otherwise maintaining a current value of the detection signal. In an embodiment, the stability criteria are based on a delay-insensitive coding scheme used to transmit data on the plurality of signal lines. In an embodiment, the system comprises: means for transmitting asynchronous data; and means for receiving asynchronous data.

BRIEF DESCRIPTION OF THE SEVERAL VIEWS OF THE DRAWINGS

Example embodiments will now be described, purely by way of non-limiting example, with reference to the annexed drawings, wherein.

DETAILED DESCRIPTION

Illustrated in the following description are various specific details aimed at providing an in-depth understanding of various embodiments. The embodiments may be provided without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in different points of this description do not necessarily refer to one and the same embodiment. Moreover, particular conformations, structures, or characteristics may be combined in any adequate way in one or more embodiments.

The references provided herein are used merely for convenience and hence do not define the sphere of protection or the scope of the embodiments.

Figure 1:
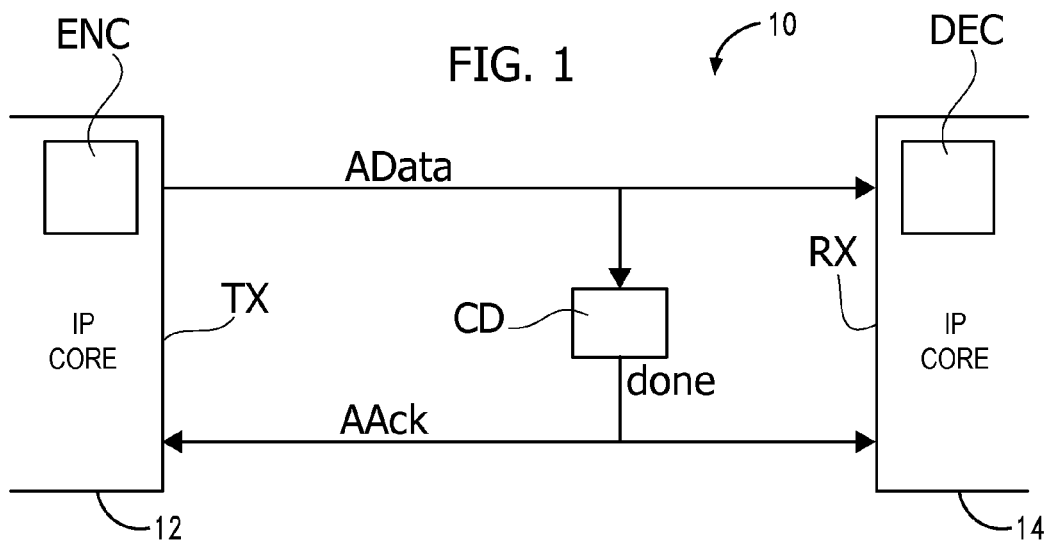
FIG. 1 is a schematic illustration of a SoC.

FIG. 1 of the annexed drawings is a schematic illustration of a context of application, for example, of SoC 10, in which asynchronous data (AData) are transmitted between a transmitter TX and a receiver RX on a communication channel with various signal lines configured, for example, as a bus. As illustrated, the transmitter TX is part of IP Core 12 and the receiver RX is part of IP Core 14. Transmission of the data may take place, for example, between an encoder ENC and a decoder DEC and envisage the transmission of a signal of acknowledgement of completion of transmission, designated in the figure as AAck. This signal is to be transmitted according to emission, by a circuit for detecting completion of transmission or completion-detector circuit (hereinafter for brevity, "CD circuit or module"), of a signal, designated by "done", that indicates the fact that the data on the signal lines of the transmission channel are stable, e.g., that transfer of data has been completed, hence "done".

FIG. 2 illustrates, once again by way of example, a possible chronogram regarding transmission of asynchronous data AData (made, for example, in four phases designated as PHASE 1, PHASE 2, PHASE 3 and PHASE 4 that follow an initial reset step or RESET) and emission of the signal AAck.

Figure 2:
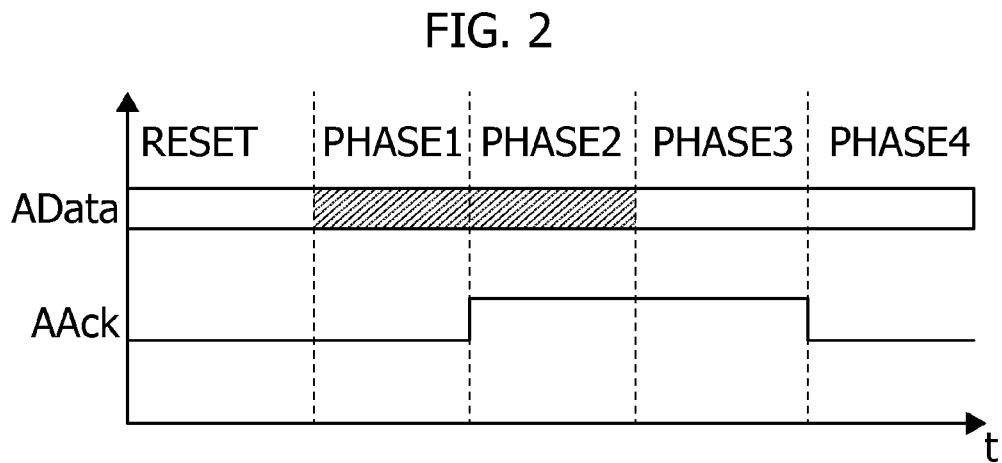
FIG. 2 is a timing diagram of a transmission of asynchronous data.

In various solutions, the scheme exemplified in FIG. 2 may correspond to the implementation of a handshake protocol based upon the following criteria:

when there are no transactions in progress, all the signals at output from the transmitter TX, and hence all the signal lines of the transmission channel, are de-asserted, for example, at the logic level 0 (condition indicated as RESET on the left in FIG. 2);

when the IP transmitter module or core sends a request and the transmitter TX wishes to start a transaction, it drives the outputs accordingly (PHASE 1 in FIG. 2);

when the receiver side RX recognizes on the signal lines of the transmission channel the condition of "valid data", e.g., of stable data, no longer subject to transitions, it samples the data and asserts an acknowledgement signal (AAck) for the transmitter TX (PHASE 2 in FIG. 2);

when the transmitter TX receives a signal AAck, it de-asserts all its outputs (PHASE 3 in FIG. 2);

when the receiver RX accordingly detects de-assertion (for example, at the logic level 0) of its inputs, it de-asserts the signal AAck (PHASE 4 in FIG. 2); and finally, when the transmitter TX recognizes that the signal AAck has been de-asserted, the system returns to the initial RESET condition, enabling possible start of a new transaction.

The inventors have noted that in such a context of application there exists the possibility of resorting to DI (Delay-Insensitive) encoding circuits and/or schemes. For example, this approach may be used for providing on-chip asynchronous connections such as to enable a convenient interconnection between on-chip units operating with different clocks. A characteristic of various DI codes lies in the capacity of enabling correct interpretation of the codeword irrespective of the delay of individual bits.

An example of such an encoding (which may be implemented, for example, at the level of the encoder ENC of FIG.

1, with corresponding decoding by the decoder DEC) is a dual-rail encoding scheme, where n wires or lines may be used for transmitting a data word of n/2 bits. This encoding scheme is simple and requires a minimum contribution of additional logic. When applied to large and complex interconnection systems, the cost linked to doubling of the width of the data path (in terms both of area of the chip and, as a consequence, of propagation delays) may, however, become unacceptable.

Another example of DI encoding, which may also be implemented, for example, at the level of the encoder ENC of FIG. 1, is m-of-n encoding, where m lines out of n lines are available for transmission at the level of logic one. In a certain sense, dual-rail encoding is a particular case of m-of-n encoding, with m=1 and n=2, e.g., where a 1-of-2 encoding is applied to each bit.

It is also possible to consider the dual-rail encoding as a 1-of-2 encoding applied to "groups" of lines of unit amplitude. The concept of group may on the other hand be generalized to the case of m-of-n encoding. For example, FIG. 3 highlights, once again schematically for simplicity of treatment, the fact that the problem of detecting the stability of the data in the terms outlined previously may be generalized to the case of bus of considerable width, in which the signal lines, and hence the data or bits transmitted, are organized (for example, at the level of encoder ENC—see FIG. 1) in a number of groups; for example, FIG. 3 is a schematic illustration of a possible 4-of-8 configuration, which represents a particular case of the more general m-of-n configuration.

Yet another example of DI encoding is Berger encoding. The Berger code is a code that may be applied to error detection in the transmission of the data. It is made up of two parts: the information or data bits (D) and check bits (CR), namely, the binary representation of the count of the information or data bits that are at 0.

For background on asynchronous communications see, e.g., M. H. Sawasaki et al., "Externally Hazard-Free Implementations of Asynchronous Control Circuits", IEEE Transactions on Computer-Aided Design of Integrated Circuit and Systems, Vol. 16, No. 8, August 1977, pp. 835-848; S. Hauck, "Asynchronous Design methodologies: An Overview-Proceedings of the IEEE, Vol. 83, No. 1, pp. 69-93, January 1995; T. H.-Y. Meng et al., "Automatic Synthesis of Asynchronous Circuits from High-level Specifications", IEEE Transactions on Computer-Aided Design, Vol. 8, Number 11, November 1989, pp. 1185-1205; G. Campobello et al., "GALS Networks on Chip: A New Solution for Asynchronous Delay-Insensitive Links", Design, Automation and Test in Europe, 2006 (DATE '06); Proceedings Volume 2; Year: 2006, pp. 1-6.

The last document contains a general discussion of dual-rail, m-of-n, and Berger encoding schemes, with the exemplification of the possible application of Berger encoding to delay-insensitive asynchronous connections in a NoC context.

Delay-insensitive encodings may in fact prove burdensome both in terms of area of silicon occupied and at the level of design flows, for example, as regards the availability of cells capable of dealing with asynchronous memory elements.

For example, to implement CD circuits (it is once again recalled that this term indicates a completion-detector circuit, e.g., a circuit that detects completion of the transmission, as presented previously) it is possible to resort to logic elements of the type commonly known as "C-elements".

This asynchronous logic component, also known as Muller C-element or Muller C-gate, is a logic circuit with hysteresis, the output of which reflects the inputs in the case of correspondence of the states of all the inputs with the capacity of remaining in this state until all the inputs undergo a transition to another state. Said circuit exists also in a version, referred to as "asymmetrical", where only some of the inputs may have an effect at the level of one of the transitions of the output.

The inventors have noted that a cell based upon C-elements are often prone to glitches during operation. Moreover, C-element cells are not suited to being treated in a simple way at the level of current design flow.

The inventors have likewise noted that said problems become even more evident in the case of application to buses of large width. In such a possible sphere of application, there may in fact arise the need for detecting that the data are stable on all the groups of data on which the bus is organized, with the consequence of using cells with C-elements with a number of inputs. This may imply a very extensive use of C-elements (also at the level of pipeline implementation).

Figure 4:
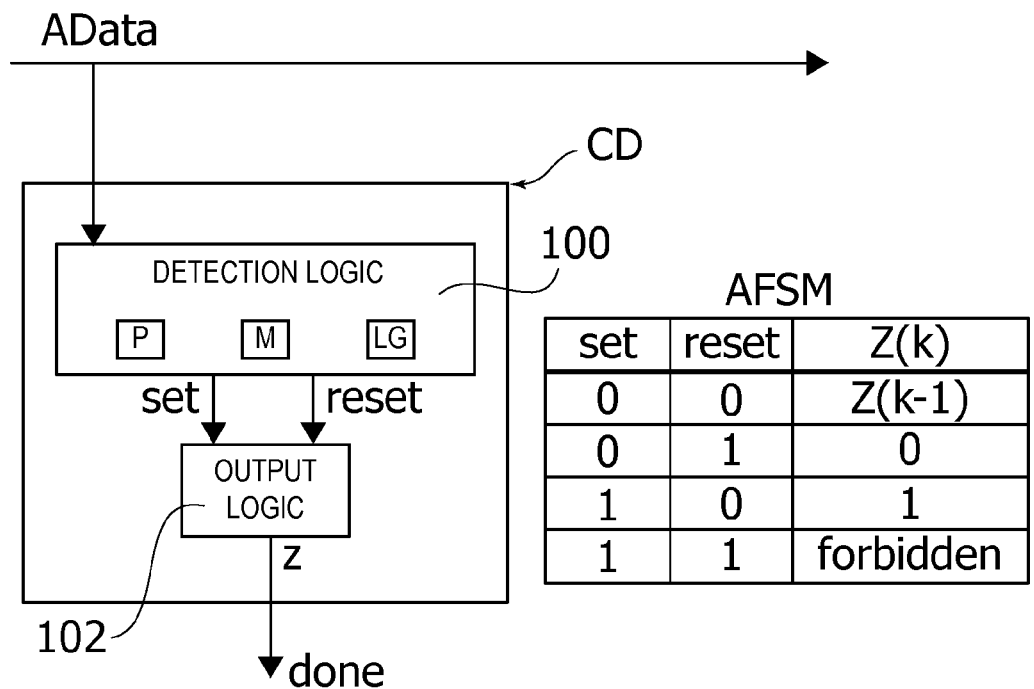
FIG. 4 is a block diagram of an embodiment of a completion detection module.

FIG. 4 et seq. refer to possible examples of embodiment of a CD circuit sensitive to the transmission of asynchronous data AData between a transmitter TX (encoder ENC) and a receiver RX (decoder DEC), for example, in the context of a SoC, where the CD circuit is able to generate a signal "done", which is designed to indicate the fact that the data on the signal lines of the bus are stable so that transfer of the data has been completed, likewise indicating the condition in which the lines have been "reset" so that the bus is ready for proceeding to a new transfer of data.

Figure 3:
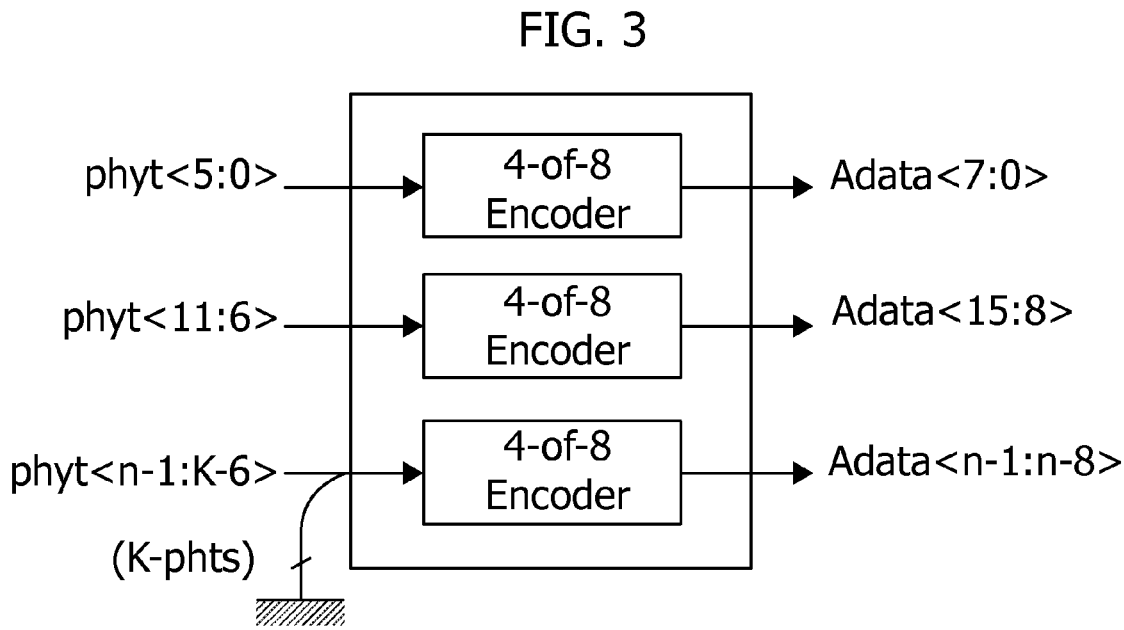
FIG. 3 is a schematic illustration of an encoder.

The foregoing regards the context of a system of the type already exemplified previously with reference to FIGS. 1 to 3. The description already provided in relation to said figures hence applies also to the various embodiments exemplified in what follows, unless otherwise specified hereinafter or indicated by the context.

FIG. 4 et seq. refer to possible examples of embodiments in which the CD circuit comprises a detection logic 100, which is configured to generate, on its output respective "set" and "reset" signals directed to an asynchronous finite-state machine (AFSM) 102 that is configured to generate, on its output, the signal "done".

Figure 5:
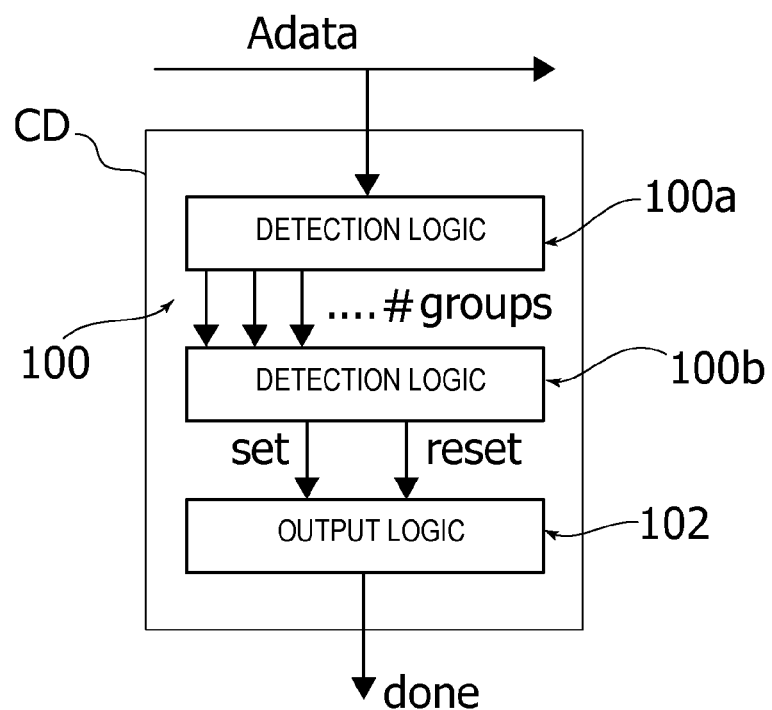
FIG. 5 is a block diagram of an embodiment of a completion detection module.

FIG. 5 refers to a possible example embodiment in which the detection logic 100 is shared in a bus detector 100a and in an aggregator module 100b.

Figure 6:
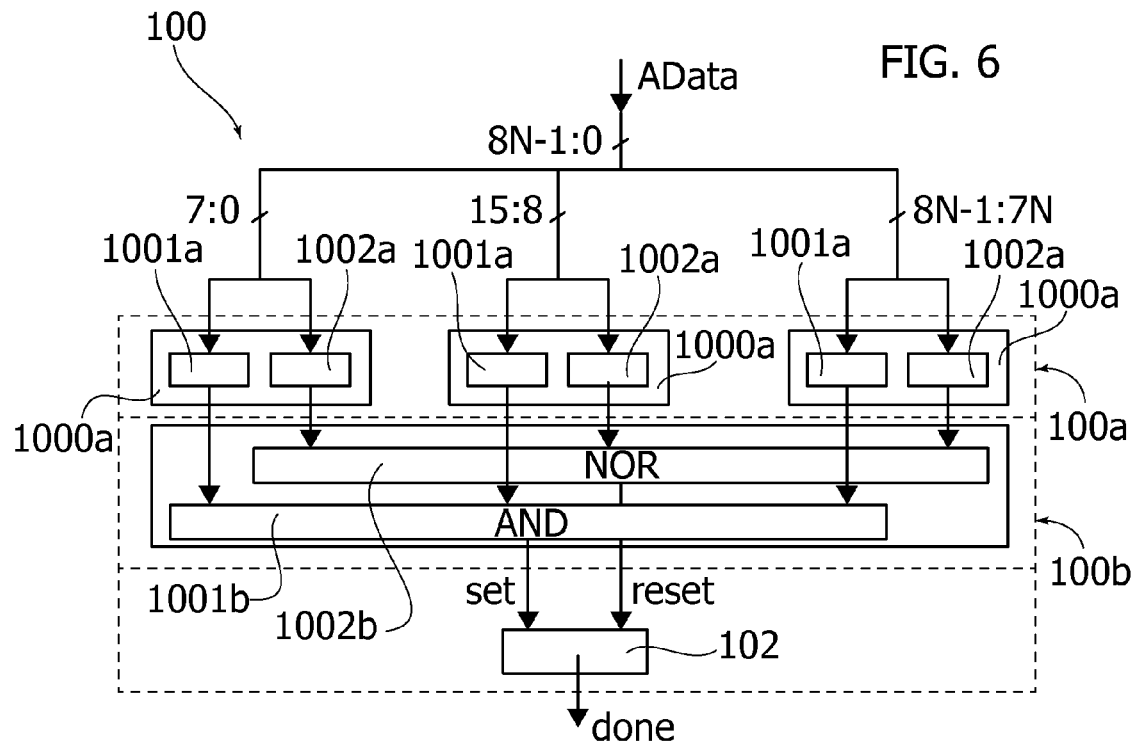
FIG. 6 is a block diagram of an embodiment of detection logic of a completion detection module.
Figure 7:
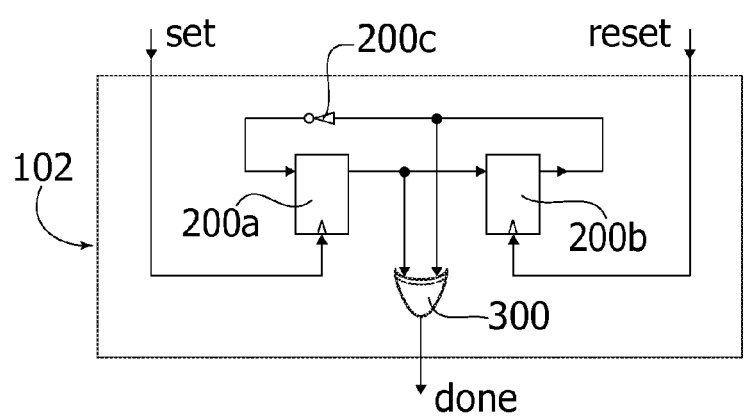
FIG. 7 is a block diagram of an embodiment of an output logic of a completion detection module.

FIG. 6 illustrates in detail a possible example of embodiment of the blocks 100a and 100b of FIG. 5, and FIG. 7 represents a possible example of embodiment of the finite-state machine 102. The detection logic 100 and output logic 102 may comprise, for example, one or more processors P, memories M, logic gates LG, discrete circuitry, etc, and various combinations thereof.

As already mentioned previously, various examples may refer to a data-transmission channel (AData in FIG. 1) comprising a bus, the bit or signal lines or wires of which are organized in a plurality of groups according to a delay-insensitive encoding scheme (e.g., m-of-n encoding, possibly 2-of-1, e.g., dual-rail, encoding, or Berger encoding).

Various embodiments may hence base their operation on the condition identifying the data are "stable" when the data of the groups in question are stable (e.g., m out of the n lines are asserted); in other words, a condition of general stability of the data may be assumed when the data are stable in each of the groups, and the reset (return-to-zero) condition may be that all the signal lines of the bus are de-asserted (for example, they are at the logic level "0").

The description of embodiments referred to in what follows is based, by way of example, on the assumption that the signals/data involved are binary signals (logic levels "0" and "1") and that the condition of asserted signal corresponds to the logic level "1", whereas the condition of de-asserted signal corresponds to the logic level "0". Persons skilled in the sector will understand that various embodiments, in any case comprised within the sphere of the present description, may adopt a complementary choice (asserted signal=logic level "0"; de-asserted signal=logic level "1") and that the criteria of implementation of the blocks 100a, 100b and 102 may then be modified accordingly, without prejudice to the criteria of operation described.

With reference to the block diagrams of FIGS. 4 and 5, a possible embodiment of the detector block or module 100a is able to detect, for each group of lines of the bus:
- the condition whereby m out of the n bits (e.g., 1 out of 2, in the dual-rail case) are stable (e.g., asserted at a first logic level, e.g., "1"); and
- the condition in which all the n bits are de-asserted (at a second logic level, e.g., "0").

These two conditions identify, respectively, the condition of stability of the data and the reset condition.

It will once again be appreciated that the description provided herein regards, by way of example, the hypothesis that the signal lines of the system bus have been arranged in a number of groups, to each of which there corresponds one of the signals at output from the module 100a and a given number of bits of the starting data (in the example of a 4-of-8 encoding, to each group there correspond 6 bits).

Various embodiments may, however, envisage recourse to a single group (e.g., to an m-of-n encoding applied on the entire datum), which may be viewed as a particular case of the more general approach based upon an arbitrary number of groups, where the number of groups is reduced to 1.

In the case where a number of groups are present, various embodiments may then envisage the presence of the block or module 100b, which has the purpose of aggregating the results obtained for the various groups of buslines from the block or module 100a and generating at output a first signal or a second signal (respectively, "set" or "reset" in the example considered herein), which, passing, for example, from the logic level "0" to the logic level "1", indicate:
- the stability condition (set) has been encountered in all the groups; and
- the reset condition (reset) has been determined in all the groups.

In various embodiments, in which recourse to a single group (e.g., to an m-of-n encoding applied on the entire datum) is envisaged, the block or module 100b may become superfluous, and the "set" and "reset" signals may be generated directly by the block or module 100a.

Furthermore, various embodiments may use various delay-insensitive encoding schemes (for example, Berger encoding), so that the stability condition and the reset condition may be detected by the block or module 100a according to criteria, to which reference will be made in what follows to some examples, other than the ones that may be applied for m-of-n encoding.

The finite-state machine 102 receives at input the two signals in question and in turn generates at output the signal "done", which in various examples of embodiment may assume:
- a first logic value or level (for example, the logic level "1", in the example here considered) when at the output of the block or module 100b the signal (set, in the example here considered) representing that the data are stable has been asserted;
- a second logic value or level (e.g., the logic level "0", in the example here considered) when at the output of the block or module 100b the signal (reset, in the example here considered) representing that the reset or return-to-zero conditions are determined has been asserted; and
- a hold state or level in the other cases, e.g., when neither one nor the other of the output signals of the block or module 100b (set and reset, in the example here considered) is asserted.

The block diagram of FIG. 6 illustrates—with reference, by way of example, to a delay-insensitive (e.g., m-of-n) encoding applied on a number of groups of buslines—a possible embodiment of the blocks or modules 100a and 100b according to a simple implementation scheme. This scheme may reduce the likelihood of glitches in operation.

In various embodiments, the block or module 100a may comprise various sub-blocks or sub-modules 1000a (for example, equal to the number of groups in which the bus is organized) with each sub-block or sub-module 1000a in turn comprising a sorter 1001a and a logic network 1002a.

The sorter 1001a may be constituted by a logic network capable of detecting when a given number of the signal lines of the respective group is asserted. In various embodiments, it may, for instance, be a logic of a combinational type capable of detecting when m of the n bits of the respective group are asserted (in the example here considered, at the logic level "1", operating, for instance, according to the solution known as "batcher") and of emitting a corresponding logic signal (e.g., "1").

The logic 1002a is able to detect when all the n bits of the respective group are de-asserted (in the example here considered, at the logic level "0", hence operating simply as an OR logic gate, the output of which goes to "0" only when all the inputs are equally at "0") and to emit a corresponding logic signal (e.g., "0").

Adopting such an embodiment, the aggregator block or module 100b may in effect be reduced to two logic gates.

In the case of operation according to the criteria exemplified previously:
- the first of these logic gates, designated by 1001b, may be simply an AND logic gate, the output of which goes to "1" (only) when all the inputs are at "1", and
- the second of these logic gates, designated by 1002b, may be simply a NOR (negated OR) logic gate, the output of which goes to "1" (only) when all the inputs are at "0".

As already mentioned, various embodiments may envisage recourse to a single group (for example, to an m-of-n encoding applied on the entire datum), which may be viewed as a particular case of the more general approach based upon an arbitrary number of groups in which the number of groups is 1: the block or module 100b may thus become superfluous, and the "set" and "reset" signals may be generated directly by the block or module 100a. In this case, if the aim is to maintain the same logic of generation of the reset signal, causing said signal to go to "1" (only) when all the n lines are at "0", the logic 1002a may be obtained as NOR logic.

Again, as already mentioned, various embodiments may use a delay-insensitive encoding of a different type (for example, dual-rail or Berger encoding) applied on a single group or on a number of groups of signal lines of the transmission channel.

As already mentioned previously, the dual-rail encoding may be simply viewed as a particular case of m-of-n encoding with m=1 and n=2.

In the case of a Berger encoding, in various embodiments:
- the function of the block or module 1001a may be implemented through a multiplexer that receives at input the data re-ordered by a sorter circuit and a selection signal (e.g., the command signal of the multiplexer) that in effect represents the sum of the zeros contained in the original datum; and/or the function of the block or module 1002*a* may be implemented as OR logic operation between all the bits of the datum and all the bits of the check (implemented, for example, with three OR logics that perform this function: one on the datum, one on the check signal, and one that combines the outputs of the two previous ORs).

Also in the case of Berger encoding, there may be applied mutatis mutandis the same considerations made previously for the case where a single group is resorted to: this is the case where the number of groups is reduced to 1 and the aggregation block or module 100*b* may thus become superfluous, with the "set" and "reset" signals that may be generated directly by the block or module 100*a* (with possible adaptations of the corresponding logic in the case where the intention is to maintain the same criteria of generation of the reset signal here exemplified).

In various embodiments, whatever the criteria adopted for detecting the condition of stability of the data and/or the RESET condition (for example adopting a particular delay-insensitive encoding) and the details of implementation, the asynchronous finite-state machine (AFSM) 102 may be configured to facilitate satisfaction of temporal relations that may arise between the various steps of the communication protocol.

In various embodiments, the asynchronous finite-state machine (AFSM) 102 may operate, for example, in any delay-insensitive communication configuration (for example on 4 phases—as already presented with reference to FIG. 2), on the basis of the following criteria:

reset (e.g., return to zero) of the lines of the bus is made by the transmitter TX only following upon reception of the asynchronous Ack signal (AAck); and transmission of a new datum is made by the transmitter TX only after reset (return to zero) of the signal AAack.

In this way, it is possible to obtain that the signals of set and reset of the CD circuit do not change simultaneously so that an event on one of these two signals is generated by a previous event on the other signal (except for the first event after the system reset).

Supposing, once again by way of example, that the set and reset signals at output from the module or block 100*b* are to be considered asserted when they are at the level "1", in various embodiments the finite-state machine 102 may correspond to the scheme illustrated by way of example in FIG. 7.

In said figure, the references 200*a* and 200*b* designate two flip-flops (for example of a D type) clocked with the set and reset signals. The outputs of the flip-flops 200*a* and 200*b* are connected to the inputs of an X-OR (exclusive OR) gate, the output of which, defining, that is, the signal "done", is bound to go to a first logic level (e.g., "1"), with reference to the example of implementation here considered, (only) when either one or the other of the inputs is at said level. The two flip-flops 200*a* and 200*b* are connected together in an inverting loop such that the output of the flip-flop 200*a* is input to the flip-flop 200*b* directly, whilst the output of the flip-flop 200*b* is input to the flip-flop 200*a* through a logic inverter 200*c*.

In various embodiments, the signals at input to the XOR operation do not change simultaneously, which may reduce the possibility of glitches.

Various embodiments may exploit the relations that intervene between the events on the set and reset signals so as to facilitate the following operating modes:

set signal asserted (e.g., at "1") only when the data on the lines of the communication channel (bus) are stable;

reset signal asserted (e.g., at "1") only after the assertion value ("1") of the signal "done" has been propagated to the transmitter TX, and the lines of the communication channel have been reset (e.g., at "0", in the examples here considered)

new assertion of the signal set when the second level ("0" in the example here considered) of the signal "done", representing the fact that the lines of the communication channel have been reset, is detected by the transmitter TX, with the possibility of entering new data on the bus.

Figure 8:
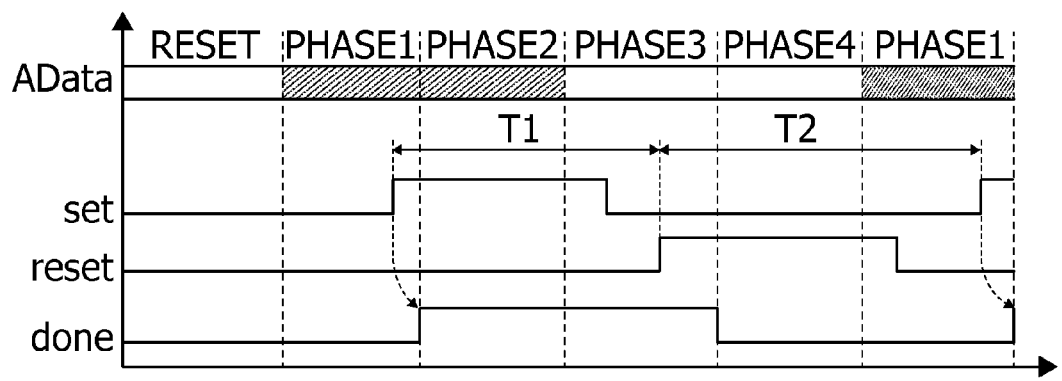
FIG. 8 is a timing diagram according to an embodiment.

The chronogram of FIG. 8 refers, by way of example, to the same 4-phase DI operating modes (handshake protocol) already considered with reference to FIGS. 1 and 2 in relation to a system comprising a transmitter TX and a receiver RX with a communication channel set in between for transmission of asynchronous data (AData) between them, the communication channel comprising signal lines organized according to a delay-insensitive encoding (encoder ENC).

In various embodiments, such a system may comprise, for example, a CD circuit according to one of the embodiments, coupled to the communication channel for producing the detection signal "done".

In various embodiments, in such a system:

the receiver RX may be configured for asserting an acknowledgement signal AAck towards the transmitter TX when the detection signal (done) assumes the aforesaid first value, indicating the fact that the asynchronous data on the channel are stable;

the transmitter TX may be configured for de-asserting its outputs towards the signal lines of the communication channel (bus) when the transmitter TX detects the assertion of the aforesaid acknowledgement signal AAck by the receiver (RX);

the receiver RX may be configured for de-asserting the acknowledgement signal AAck towards the transmitter (TX) when the detection signal (done) assumes the second value, indicating the fact that the transmitter TX has de-asserted its outputs towards the signal lines of the communication channel;

the transmitter TX may be configured for acknowledging de-assertion of the acknowledgement signal AAck by the receiver RX, so that the system is reset for a new transmission of asynchronous data (AData) on said communication channel.

With said operating modes, in various embodiments, the delays of propagation of the transitions (delay determined principally, in the example of embodiment here considered, by the propagation delays of the flip-flops 200*a* and 200*b*) may be in any case rendered shorter than:

the interval T1 that elapses between the instant of assertion (passage to the logic level "1") of the set signal and the next instant of assertion (passage to the logic level "1") of the reset signal; and the interval T2 that elapses between said instant of assertion (passage to the logic level "1") of the reset signal and the next instant of assertion of the set signal.

The aforesaid conditions on the propagation delays may in any case be easily satisfied.

Various embodiments enable significant advantages to be achieved in terms of productivity at the level of design and of time-to-market, likewise enabling recourse to safer solutions thanks to the possibility of resorting to cells of a standard type.

The foregoing is obtained at the same time achieving an improvement in terms of performance of the corresponding system, for example, of the System-on-Chip (SoC) type, which may be applied to numerous different contexts.

Of course, the details of construction and the embodiments may vary, even significantly, with respect to what has been illustrated herein purely by way of non-limiting example, without thereby departing from the sphere of the disclosure.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), state machines, complex programmable logic devices (CPLDs), etc., as well as devices that employ RFID technology. In some embodiments, some of the modules or controllers separately described herein may be combined, split into further modules and/or split and recombined in various manners.

The systems, modules and data structures may also be transmitted as generated data signals (e.g., as part of a carrier wave) on a variety of computer-readable transmission mediums, including wireless-based and wired/cable-based mediums.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
input circuitry configured to detect data on a plurality of signal lines and to generate:
a first signal indicative of asynchronous data on said plurality of signal lines satisfying a stability criteria; and
a second signal indicative of said plurality of signal lines being de-asserted; and
output circuitry configured to generate a detection signal having:
a first value when said first signal is asserted; and
a second value when said second signal is asserted, wherein the output circuitry is configured to hold a current value of the detection signal when the first and second signals are not asserted.

2. The device of claim 1 wherein the output circuitry comprises an asynchronous finite state machine.

3. The device of claim 2 wherein said asynchronous finite state machine comprises:
a first flip-flop clocked by said first signal;
a second flip-flop clocked by said second signal, wherein the first flip-flop and the second flip-flop are coupled together in a loop; and
a detection signal generator configured to generate the detection signal based on an output of the first flip-flop and an output of the second flip-flop.

4. The device of claim 3 wherein the loop is configured to couple the output of the first flip-flop to an input of the second flip-flop and to couple an inverted output of the second flip-flop to an input of the first flip-flop.

5. The device of claim 3 wherein the detection signal generator comprises logic configured to exclusive-or the output of the first flip-flop and the output of the second flip-flop.

6. The device of claim 1 wherein the stability criteria is based on a delay-insensitive coding scheme.

7. The device of claim 6 wherein said delay-insensitive coding scheme comprises at least one of a dual-rail coding scheme; an m-of-n coding scheme; and a Berger coding scheme.

8. The device of claim 1 wherein said plurality of signal lines include one or more groups of signal lines and said input circuitry is configured to:
determine, for each group, whether data on the signal lines of the group satisfy a group-stability criteria;
in response to determining that data on the signal lines of each group satisfy the group-stability criteria, assert the first signal;
determine, for each group, whether the signal lines of the group are de-asserted; and
in response to determining that the signal lines of each group are de-asserted, assert the second signal.

9. The device of claim 8 wherein the group-stability criteria is based on a delay-insensitive coding scheme.

10. The device of claim 9 wherein said delay-insensitive coding scheme comprises at least one of a dual-rail coding scheme; an m-of-n coding scheme; and a Berger coding scheme.

11. The device of claim 9 wherein the input circuitry is configured to determine whether the group-stability criteria is satisfied by determining whether a given number of signal lines of the respective group are asserted.

12. The device of claim 9 wherein the lines of each group are organized in a delay-insensitive Berger coding arrangement and the input circuitry includes a sorter configured to rearrange asynchronous data of a group and a multiplexer which receives said asynchronous data rearranged by the sorter, wherein a control signal of the multiplexer is based on a number of zeros contained in said asynchronous data of the group.

13. The device of claim 9 wherein the input circuitry comprises at least one logic gate configured to determine whether all the lines of a group are de-asserted.

14. The device of claim 13 wherein the lines in each group are organized in a delay-insensitive Berger coding arrangement, wherein said at least one logic gate is configured to determine whether all the data bits and check bits in the Berger coding are de-asserted.

15. The device of claim 1, wherein the input circuitry is configured to determine a signal line is de-asserted when the signal line has a logic level "0".

16. A system, comprising:
a transmitter;
a receiver;
a communication channel including a plurality of signal lines and configured to carry asynchronous data between the transmitter and receiver; and
a detector coupled to the plurality of signal lines and including:
input circuitry configured to detect data on the plurality of signal lines and to generate:
a first signal indicative of asynchronous data on said plurality of signal lines satisfying a stability criteria; and
a second signal indicative of said plurality of signal lines being de-asserted; and
output circuitry configured to generate a detection signal having:
a first value when the first signal is asserted; and
a second value when said second signal is asserted, wherein the output circuitry is configured to hold a current value of the detection signal when the first and second signals are not asserted.

17. The system of claim 16 wherein:
the receiver is configured to transmit an acknowledgement signal to the transmitter when said detection signal has said first value;
the transmitter is configured to de-assert outputs to the signal lines of said communication channel when the transmitter detects said acknowledgment signal transmitted by the receiver;
the receiver is configured to de-assert said acknowledgment signal when said detection signal has said second value; and
the transmitter is configured to recognize said acknowledgment signal being de-asserted by the receiver.

18. The system of claim 16 wherein said system is a System-on-Chip (SoC).

19. The system of claim 16 wherein the output circuitry comprises an asynchronous finite state machine including:
a first flip-flop clocked by said first signal;
a second flip-flop clocked by said second signal, wherein the first flip-flop and the second flip-flop are coupled together in a loop; and
a detection signal generator configured to generate the detection signal based on an output of the first flip-flop and an output of the second flip-flop.

20. The system of claim 19 wherein the loop is configured to couple the output of the first flip-flop to an input of the second flip-flop and to couple an inverted output of the second flip-flop to an input of the first flip-flop.

21. The system of claim 19 wherein the detection signal generator comprises logic configured to exclusive-or the output of the first flip-flop and the output of the second flip-flop.

22. The system of claim 16 wherein the stability criteria is based on a delay-insensitive coding scheme.

23. The system of claim 16 wherein said plurality of signal lines include one or more groups of signal lines and said input circuitry is configured to:
determine, for each group, whether data on the signal lines of the group satisfy a group-stability criteria;
in response to determining that data on the signal lines of each group satisfy the group-stability criteria, assert the first signal;
determine, for each group, whether the signal lines of the group are de-asserted; and
in response to determining that the signal lines of each group are de-asserted, assert the second signal.

24. The system of claim 23 wherein the group-stability criteria is based on a delay-insensitive coding scheme.

25. A method, comprising:
asserting a first signal when asynchronous data on a plurality of signal lines satisfy a stability criteria;
asserting a second signal when the signal lines are de-asserted;
generating a detection signal having a first value when the first signal is asserted and a second value when the second signal is asserted; and
maintaining a current value of the detection signal when the first signal and the second signal are not asserted.

26. The method of claim 25 wherein the stability criteria are based on a delay-insensitive coding scheme.

27. The method of claim 25 wherein the plurality of signal lines comprise a plurality of groups of signal lines and the method includes:
determining, for each group, whether data on the signal lines of the group satisfy a group-stability criteria;
in response to determining that data on the signal lines of each group satisfy the group-stability criteria, asserting the first signal;
determining, for each group, whether the signal lines of the group are de-asserted; and
in response to determining that the signal lines of each group are de-asserted, asserting the second signal.

28. A system, comprising:
means for determining whether asynchronous data on a plurality of signal lines satisfy a stability criteria;
means for determining whether the signal lines of the plurality are de-asserted; and
means for setting a detection signal to a first value in response to a determination that the asynchronous data on the plurality of signal lines satisfy the stability criteria, setting the detection signal to a second value in response to a determination that the plurality of signal lines are de-asserted, and otherwise maintaining a current value of the detection signal.

29. The system of claim 28 wherein the stability criteria are based on a delay-insensitive coding scheme used to transmit data on the plurality of signal lines.

30. The system of claim 28, comprising:
means for transmitting asynchronous data; and
means for receiving asynchronous data.

* * * * *